(12) United States Patent
Yu et al.

(10) Patent No.: US 8,962,407 B2
(45) Date of Patent: Feb. 24, 2015

(54) METHOD AND DEVICE TO ACHIEVE SELF-STOP AND PRECISE GATE HEIGHT

(75) Inventors: Hong Yu, Rexford, NY (US); Wang Haiting, Clifton Park, NY (US); Yongsik Moon, Menands, NY (US); James Lee, Mechanicville, NY (US); Huang Liu, Halfmoon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 101 days.

(21) Appl. No.: 13/596,808

(22) Filed: Aug. 28, 2012

(65) Prior Publication Data

US 2014/0061732 A1   Mar. 6, 2014

(51) Int. Cl.
*H01L 21/338* (2006.01)

(52) U.S. Cl.
USPC ...... 438/183; 438/591; 257/369; 257/E21.453

(58) Field of Classification Search
USPC .................................. 257/E21.443; 438/183
See application file for complete search history.

(56) References Cited

U.S. PATENT DOCUMENTS

| | | | | |
|---|---|---|---|---|
| 2003/0234422 A1* | 12/2003 | Wang et al. | | 257/336 |
| 2006/0286729 A1* | 12/2006 | Kavalieros et al. | | 438/183 |
| 2009/0011563 A1* | 1/2009 | Hanafi | | 438/285 |
| 2009/0042348 A1* | 2/2009 | Yamamoto | | 438/275 |
| 2011/0241184 A1* | 10/2011 | Han et al. | | 257/640 |
| 2012/0248509 A1* | 10/2012 | Guo et al. | | 257/288 |

* cited by examiner

*Primary Examiner* — Wensing Kuo
*Assistant Examiner* — Shaka White
(74) *Attorney, Agent, or Firm* — Ditthavong & Steiner, P.C.

(57) ABSTRACT

A method for enabling fabrication of RMG devices having a low gate height variation and a substantially planar topography and resulting device are disclosed. Embodiments include: providing on a substrate two dummy gate electrodes, each between a pair of spacers; providing a source/drain region between the two dummy gate electrodes; and forming a first nitride layer over the two dummy gate electrodes and the source/drain region, wherein the first nitride layer comprises a first portion over the dummy gate electrodes and a second portion over the source/drain region, and the second portion has an upper surface substantially coplanar with an upper surface of the dummy gate electrodes.

14 Claims, 12 Drawing Sheets

METHOD AND DEVICE TO ACHIEVE SELF-STOP AND PRECISE GATE HEIGHT

TECHNICAL FIELD

The present disclosure relates to a fabrication of logic gates. The present disclosure is particularly applicable to fabrication of replacement metal gates (RMGs) in 20 nanometer (nm) technology nodes and beyond.

BACKGROUND

In fabrication of logic gates, particularly fabrication of RMGs using traditional RMG modules, topography of the resulting device is particularly important to performance, reliability, and a manufacturability of the device. Further, as technology has continued to allow for the fabrication of smaller technology nodes, the effects of topography variations have increased. However, topography variation, layer thickness variation, and defects are frequently caused by traditional RMG modules. For instance, during traditional RMG modules the gate etch causes topography variation. In another example, a metal chemical mechanical polishing (CMP) leaves metal residue causing the trench silicide and gate electrode to short and also causing a thickness variation in an exposed oxide formed by flow-controlled vertical deposition (FCVD). Additionally, high density plasma (HDP) deposition induces bubble defects in the oxide formed by FCVD. The resulting device using traditional RMG modules may contain topography variations exceeding 100 angstroms (Å), causing a degradation in performance, reliability, and a manufacturability, particularly in 20 nm technology nodes and beyond. Further, such variations in a single gate using traditional RMG modules may cause a gate height variation between gates that exceeds more than 200 Å, resulting in further degradation in performance, reliability, and manufacturability of the resulting device.

Efforts to mitigate such variations include, for instance, reducing the gate etching intensity. However, such a reduction results in degradation of the gate oxide quality. Additionally, a removal amount for CMP may be increased to reduce thickness variation in the oxide. However, such an increase may cause a high-K metal gate (HKMG) filling problem with a high aspect ratio. Further, the oxide layer formed by FCVD may be increased in thickness and the HDP deposition may be decreased to mitigate the bubble defect. However, such a modification may result in a high dishing caused by HDP CMP due to the exposure of the oxide, resulting in an increase in gate height variation.

A need therefore exists for methodology enabling fabrication of RMGs having a low gate variation and a substantially planar topography, and the resulting device.

SUMMARY

An aspect of the present disclosure is a method of fabricating a semiconductor device having a nitride deposition, after SiCoNi etch back of oxide and before a HDP deposition, to serve, inter alia, as a self-stop layer during etching of a dummy gate, and gate oxide clean.

Another aspect of the present disclosure is a method of fabricating a semiconductor device having a nitride deposition to serve, inter alia, as a CMP stop layer during metal CMP by using a high selectivity slurry to nitride.

A further aspect of the present disclosure is a device having, inter alia, a nitride layer on an oxide layer having an upper surface coplanar with an upper surface of RMGs.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing on a substrate two dummy gate electrodes, each between a pair of spacers; providing a source/drain region between the two dummy gate electrodes; and forming a first nitride layer over the two dummy gate electrodes and the source/drain region, wherein the first nitride layer includes a first portion over the dummy gate electrodes and a second portion over the source/drain region, and the second portion has an upper surface substantially coplanar with an upper surface of the dummy gate electrodes.

Some aspects include a method wherein the source/drain region includes: an embedded silicon germanium and/or silicon phosphate (eSiGe/SiP); a second nitride layer; and an oxide layer formed by FCVD. Additional aspects include forming the oxide layer to a thickness of between 100 Å and 200 Å. Further aspects include: forming a layer of HDP oxide on the second portion of the first nitride layer, wherein an upper surface of the HDP oxide is substantially coplanar with an upper surface of the first portion of the first nitride layer. Some aspects include forming the HDP oxide layer by: depositing HDP oxide on the first and second portions of the first nitride layer; and performing CMP down to the upper surface to the first portion of the first nitride layer. Additional aspects include removing the first portion of the first nitride layer and the HDP oxide layer down to the upper surface of the dummy gate electrodes. Further aspects include removing the dummy gate electrodes, forming a cavity between each pair of spacers. Some aspects include removing the dummy gate electrodes by a wet and dry etch using the first nitride layer as a self-stop layer. Additional aspects include: forming a high-k layer in each cavity, after removal of the dummy gate electrodes; and forming a RMG electrode on each high-k layer. Further aspects include performing CMP of the RMG electrodes down to a predetermined height for the RMG electrodes using a high selectivity slurry to nitride, followed by buffing the first nitride layer down to an upper surface of the RMG electrodes. Some aspects include: forming an interlayer dielectric (ILD) layer over the RMG electrodes and source/drain region; forming a contact trench through the ILD, first nitride, oxide formed by FCVD, and second nitride down to the eSiGe/SiP; forming a silicide on the eSiGe/SiP; and filling the contact trench with a metal plug.

Another aspect of the present disclosure is a device including: a substrate; two RMGs on the substrate; and a source/drain stack between the two RMGs, the source/drain stack including: a first nitride layer; an oxide layer formed by FCVD on the first nitride layer; and a second nitride layer on the oxide layer, the second nitride layer having an upper surface coplanar with an upper surface of the RMGs.

Aspects include a circuit including the source/drain stack further having a layer of an embedded silicon germanium and/or silicon phosphate (eSiGe/SiP) under the first nitride layer. Additional aspects include an ILD layer over the two RMGs and the second nitride layer. Further aspects include a metal plug through the ILD layer, the second nitride layer, the oxide layer, and the first nitride layer down to the eSiGe/SiP. Some aspects include a silicide formed on the eSiGe/SiP under the metal plug. Additional aspects include an RMG height variation of less than 100 Å.

Another aspect of the present disclosure is a method including: providing on a substrate two polysilicon gate electrodes, each between a pair of spacers; providing a source/drain region between the two polysilicon gate electrodes, the source/drain region having eSiGe/SiP, a first nitride layer, and an oxide layer formed by FCVD; SiCoNi etching the oxide layer to a thickness of between 100 Å and 300 Å; forming a second nitride layer over the two polysilicon gate electrodes and the source/drain region, wherein the second nitride layer includes a first portion over the polysilicon gate electrodes and a second portion over the source/drain region, and the second portion has an upper surface substantially coplanar with an upper surface of the polysilicon gate electrodes; depositing an HDP oxide on the first and second portions of the second nitride layer; and performing CMP of the HDP oxide down to the upper surface of the first portion of the second nitride layer, the upper surface of the HDP oxide surface on the second portion of the second nitride layer being substantially coplanar with an upper surface of the first portion of the second nitride layer; removing the HDP oxide layer and the first portion of the second nitride layer down to the upper surface of the polysilicon gate electrodes; removing the polysilicon gate electrodes by a partial dry etch followed by a wet etch using the second nitride layer as a self-stop layer, forming a cavity between each pair of spacers; forming a high-k layer in each cavity, after removing the polysilicon gate electrodes; and forming a RMG electrode of aluminum (Al) or tungsten (W) on each high-k layer.

Aspects include: performing CMP of the RMG electrodes down to a predetermined height for the RMG electrodes using a high selectivity slurry to nitride, the RMG electrodes having a height variation of less than 100 Å; and performing a nitride buffing down to the predetermined height for the RMG electrodes. Some aspects include: forming an ILD layer over the RMG electrodes and source/drain region; forming a contact trench through the ILD, second nitride, oxide formed by FCVD, and first nitride layers down to the eSiGe/SiP; forming a silicide on the eSiGe/SiP; and filling the contact trench with a tungsten (W) plug.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of topography variations attendant upon forming RMG devices. In accordance with embodiments of the present disclosure, a nitride layer is formed on an oxide layer having an upper surface coplanar with an upper surface of RMGs. The nitride layer, inter alia, may act as a self-stop layer during gate etch and gate oxide clean and as a stop purpose layer during a metal CMP by using a high selectivity slurry to nitride, resulting in a precise gate height control.

Methodology in accordance with embodiments of the present disclosure includes: providing on a substrate two dummy gate electrodes, each between a pair of spacers; providing a source/drain region between the two dummy gate electrodes; and forming a first nitride layer over the two dummy gate electrodes and the source/drain region, wherein the first nitride layer includes a first portion over the dummy gate electrodes and a second portion over the source/drain region, and the second portion has an upper surface substantially coplanar with an upper surface of the dummy gate electrodes.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
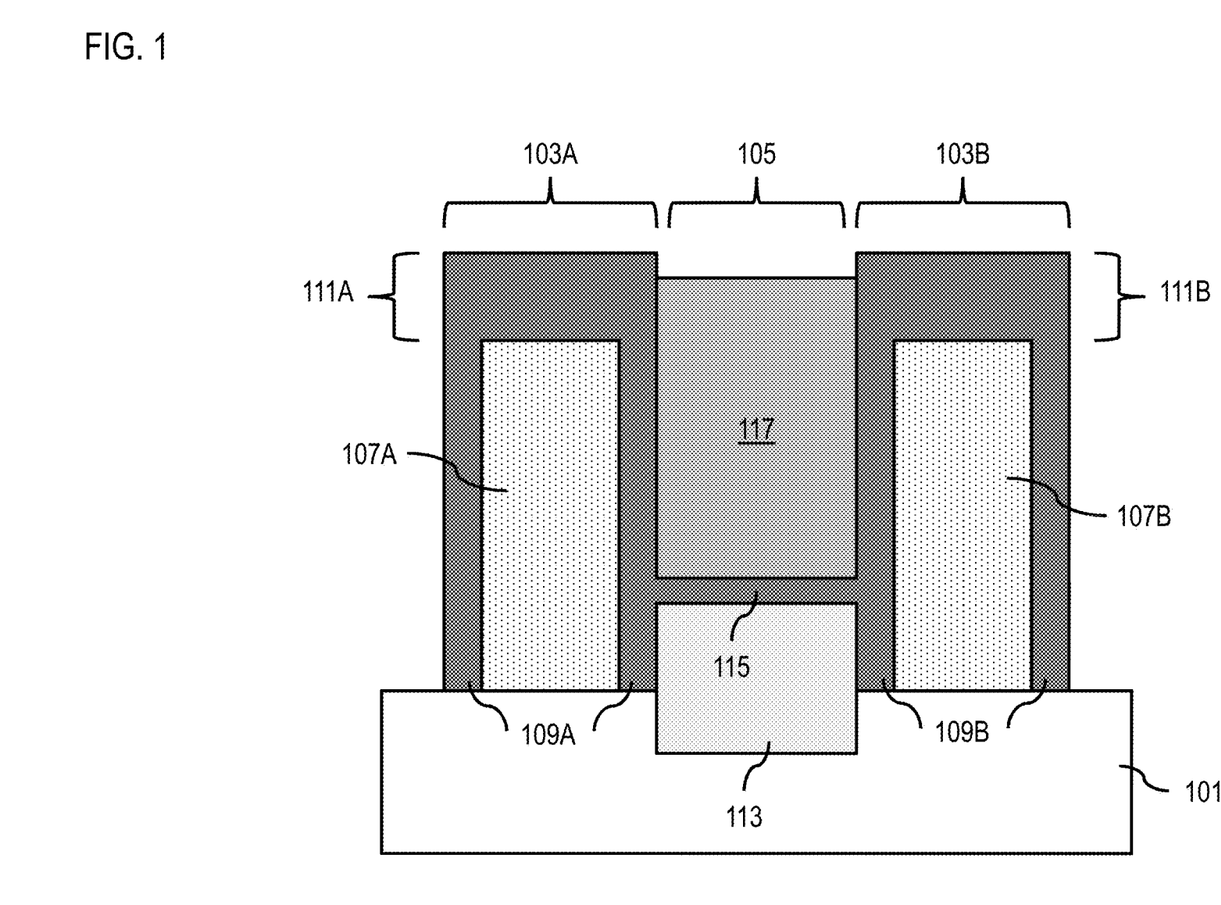
FIGS. 1 through 12 schematically illustrate sequential steps of a method in accordance with an exemplary embodiment.

Adverting to FIG. 1, in accordance with an exemplary embodiment, a substrate 101 is provided with gate regions 103a and 103b, and a drain/source region 105 therebetween. The gate regions 103a and 103b each have a dummy gate electrode 107a and 107b, respectively, of polysilicon or amorphous silicon having a height of 450-600 Å. Dummy gate electrodes 107a and 107b are between spacers 109a and 109b, respectively, and include a capping layer of nitride (e.g., silicon nitride) 111a and 111b, respectively, having a thickness of 100-300 Å. The source/drain region 105 includes an eSiGe/SiP 113 having a thickness of 50-2000 Å, a first nitride layer 115 having a thickness of 20-150 Å, and an oxide layer 117 formed by FCVD. The substrate 101, as illustrated in FIG. 1 is formed using traditional methods.

Figure 2:
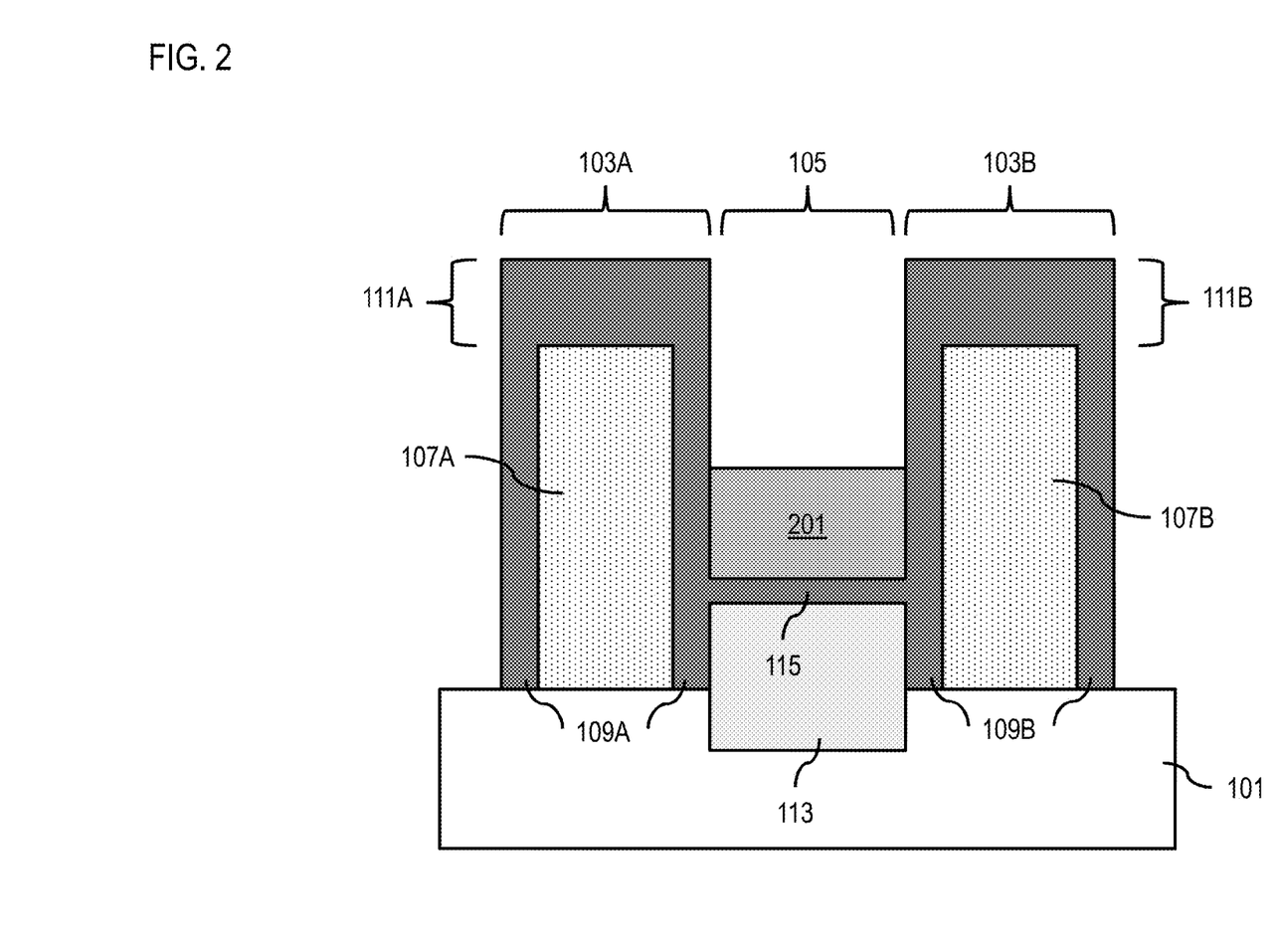

Adverting to FIG. 2 the oxide layer 117 is etched back using, for instance in-situ dry chemical cleaning technology (SiCoNi), to form an oxide layer 201. The oxide layer 201 is formed, for example, to a thickness of between 100 Å and 300 Å.

Figure 3:
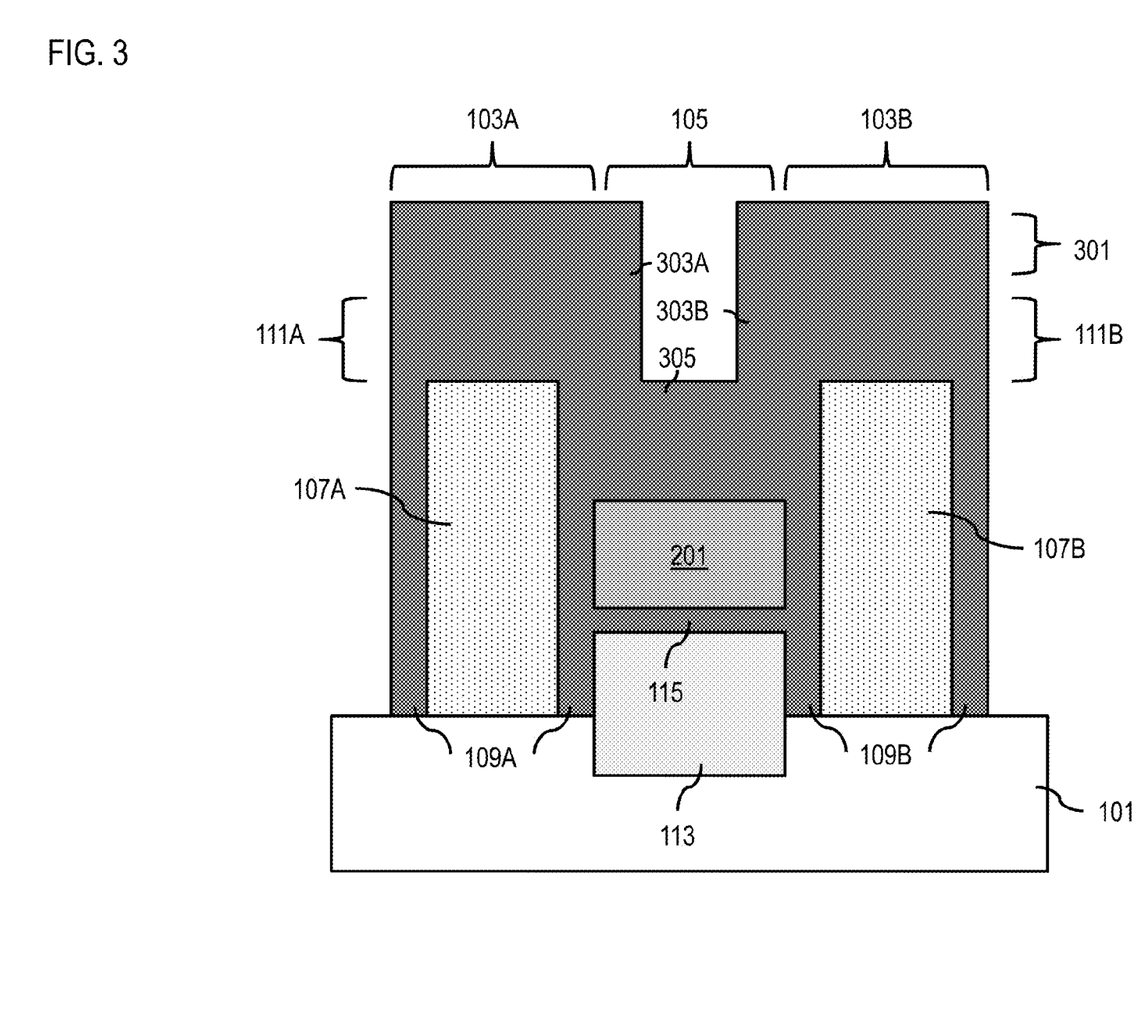

As illustrated in FIG. 3, a layer of nitride 301 is formed over the substrate 101 with first portions 303a and 303b over the gate regions 103a and 103b, respectively. Nitride layer 301 has a combined thickness with the nitride layer 111a or 111b of 200-500 Å. Nitride layer 301 has a second portion 305 over the drain/source region 105 having a thickness of between 100 Å and 200 Å. The nitride layers (e.g., capping layers 111a and 111b, first layer 115, and layer 301, etc.) include silicon nitride and nitride-like materials such as, for instance, catalyst-assisted silicon carbon nitride (SiCN). The second portion 305 has an upper surface substantially coplanar with an upper surface of the dummy gate electrodes 107a and 107b.

Figure 4:
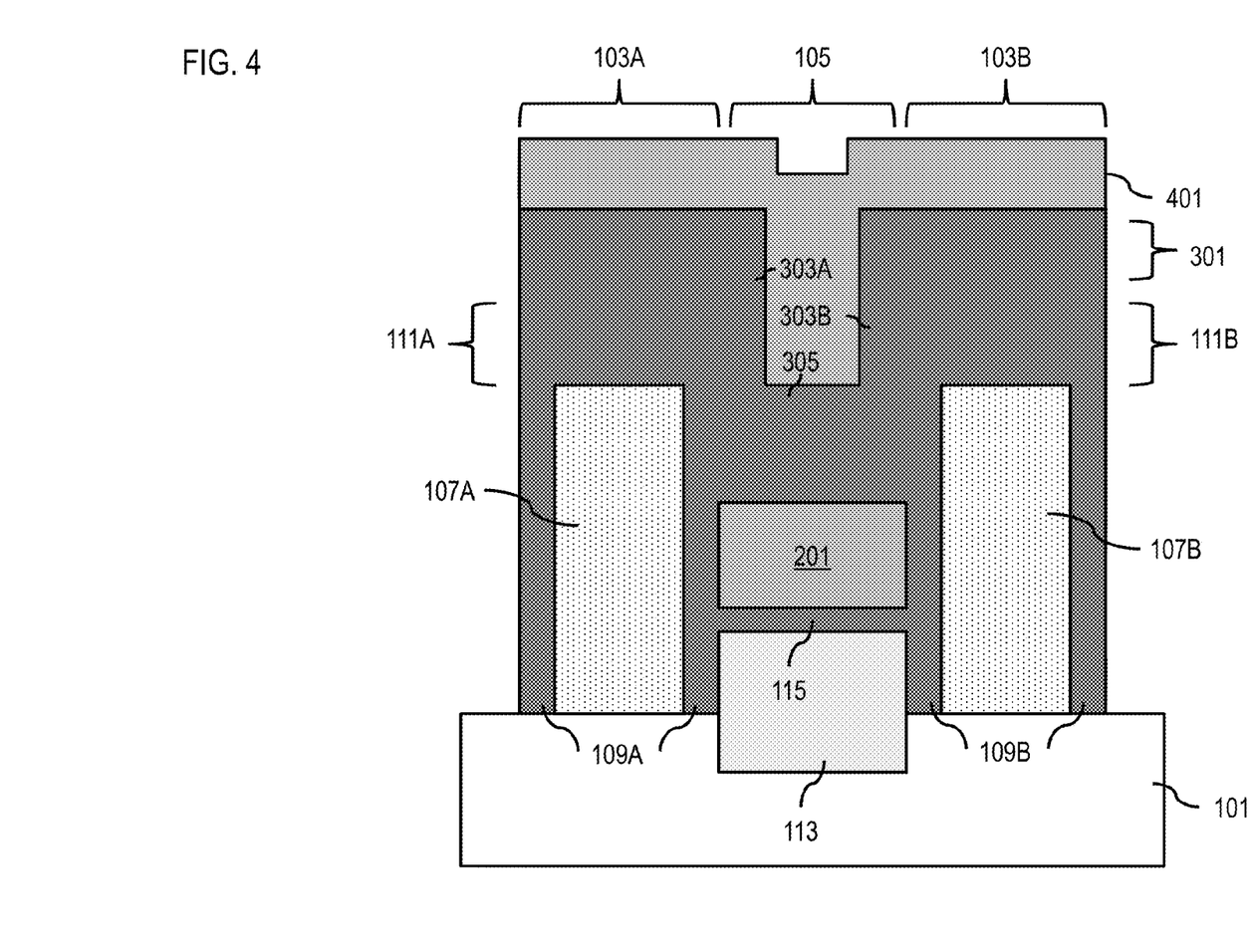
Figure 5:
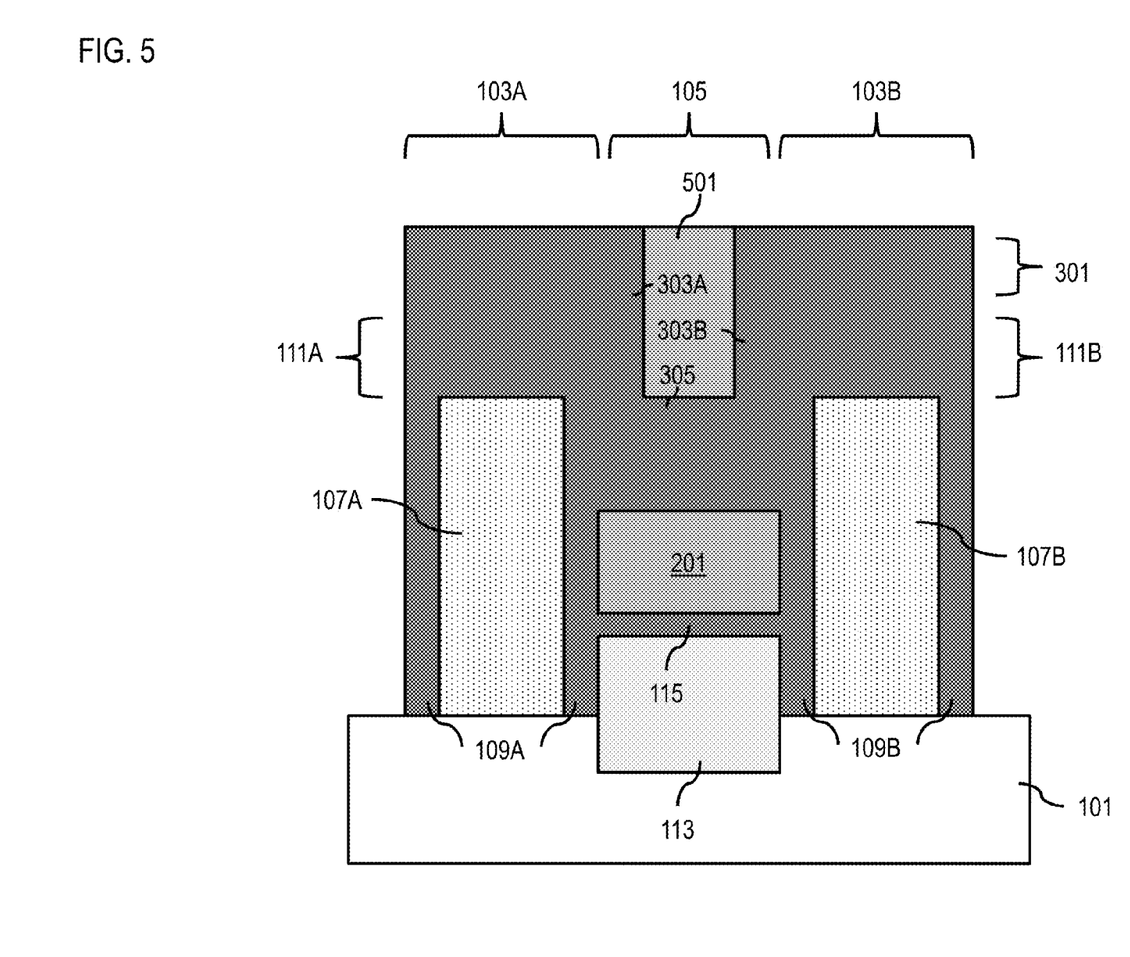

Adverting to FIG. 4, a HDP oxide 401 is deposited on the nitride layer 301. Next, as illustrated in FIG. 5, a CMP of the HDP oxide 401 is performed to remove the HDP oxide layer 401 from the first portions 303a and 303b, leaving an HDP oxide layer 501 over the second portion 305. The HDP oxide layer 501 over the second portion 305 is substantially coplanar with an upper surface of the first portions 303a and 303b. It is noted that although the HDP CMP may form dishing on the oxide layer 501, performance of the resulting device is not degraded, because the top oxide will be completely removed by subsequent etch and clean steps.

Figure 6:
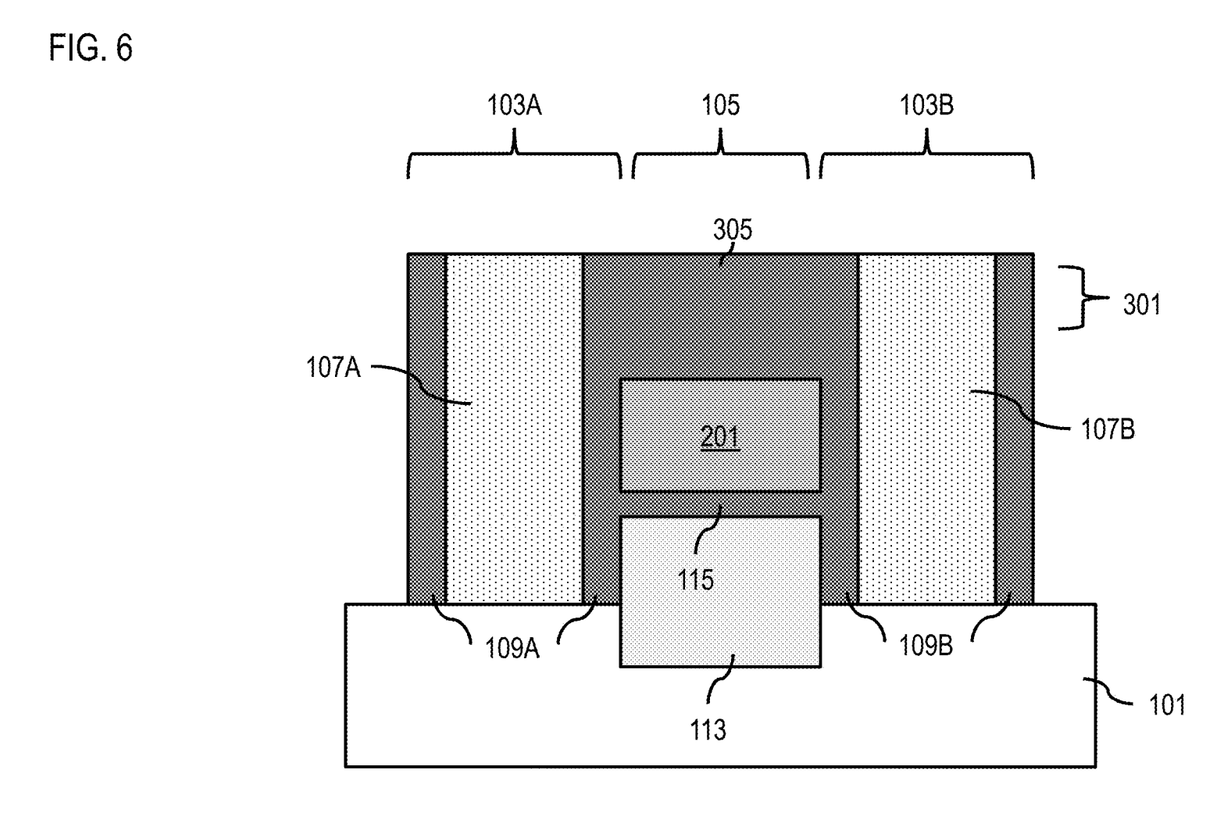
Figure 7:
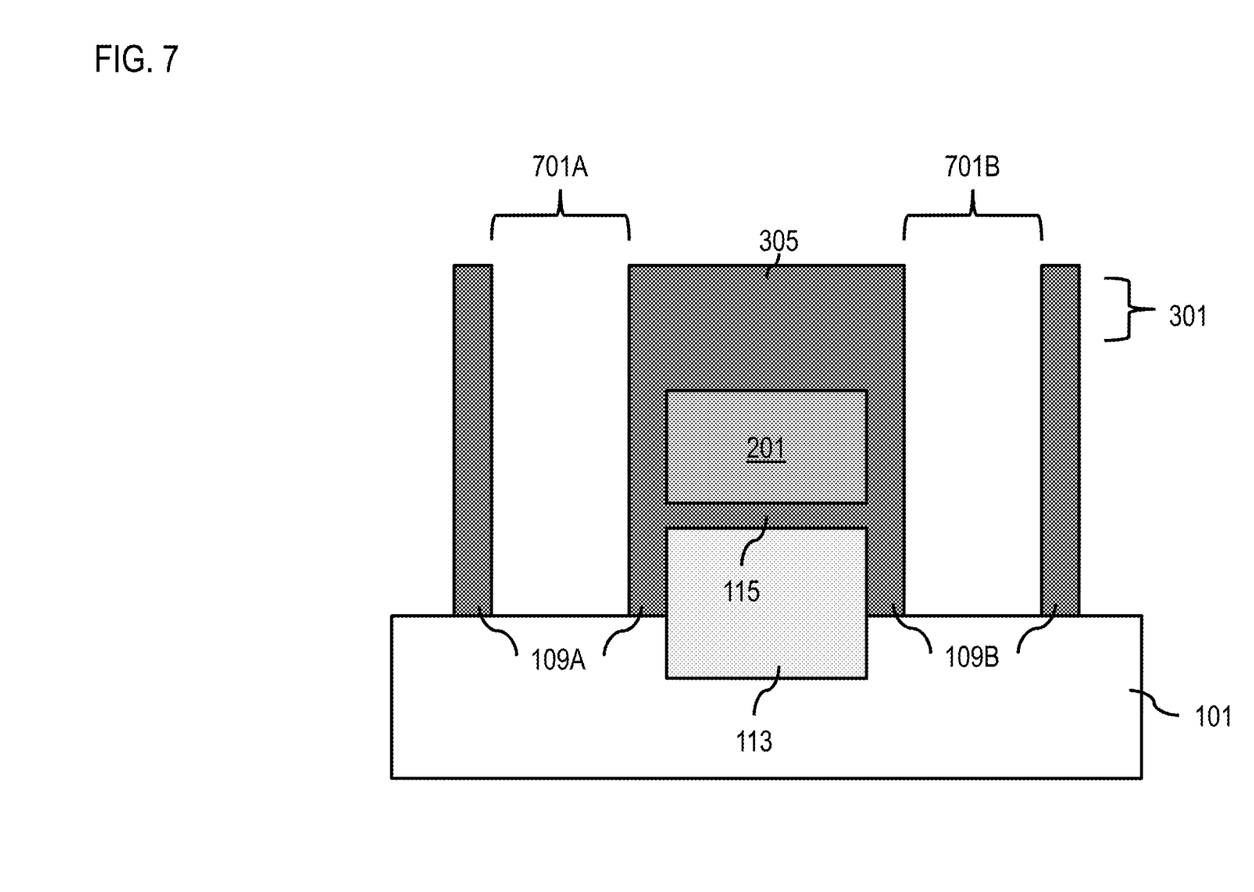

Adverting to FIG. 6, the HDP oxide layer 501 and the first portions 303a and 303b of the nitride layer 301 are removed down to the upper surface of the dummy gate electrodes 107a and 107b, using, for instance, a nitride cap reactive-ion etching (RIE). After the RIE, the second portion 305 of the nitride layer 301 has a thickness of between 50 Å and 200 Å. Additionally, as shown in FIG. 7, the dummy gate electrodes 107a and 107b are removed by a partial dry etch followed by a wet etch using the nitride layer 301 as a self-stop. After removal of the dummy gate electrodes 107a and 107b, cavities 701a and 701b remain between spacers 109a and 109b, respectively. SiCoNi may then be used to clean each cavity 701a and 701b to remove any remaining oxide (e.g., oxide layers 401 and 501).

Figure 8:
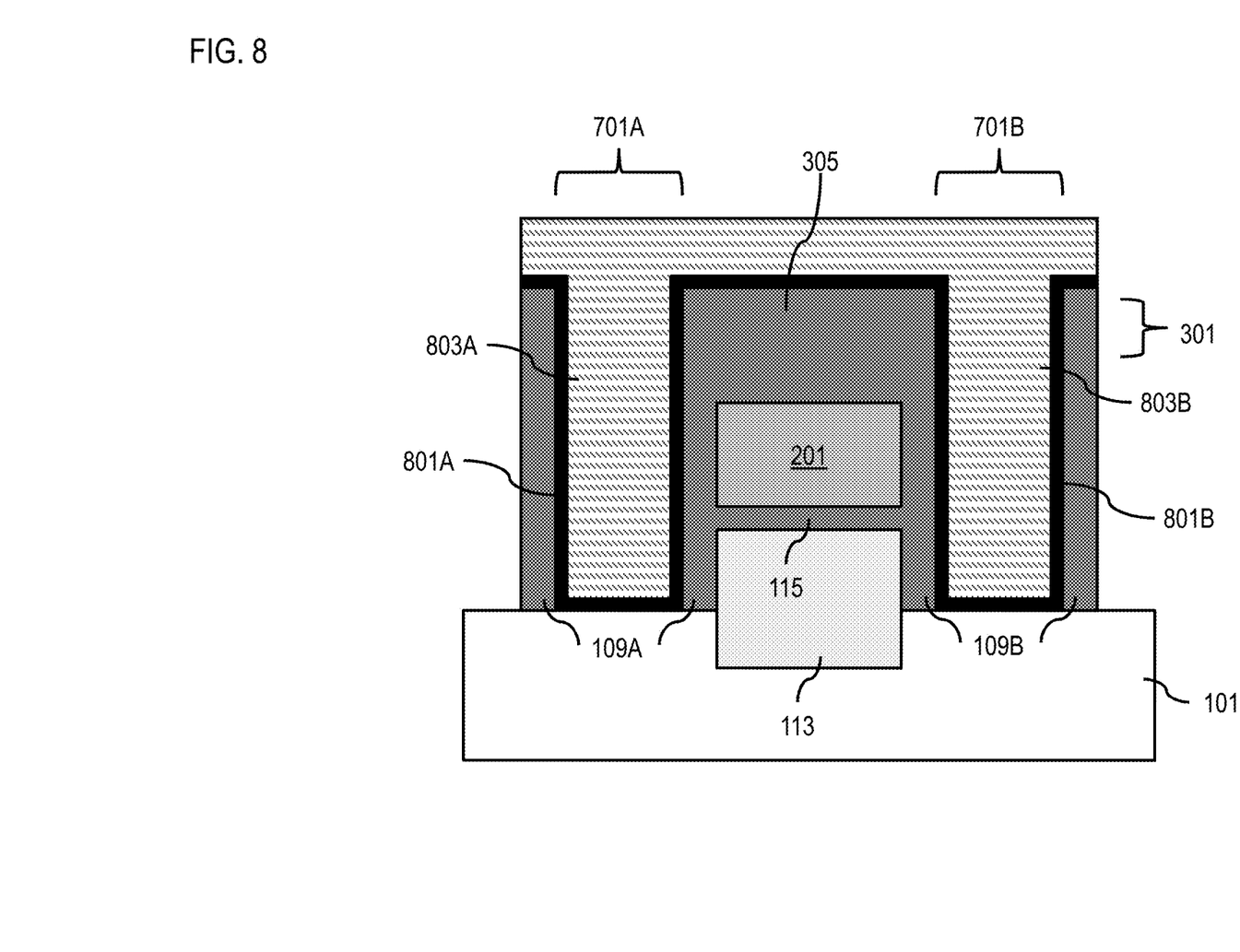

As illustrated in FIG. 8, high-k layers 801a and 801b, each having a thickness of between 10 Å and 50 Å, are formed in cavities 701a and 701b, respectively, and RMG electrodes 803a and 803b, formed of aluminum (Al) or tungsten (W), fill cavities 701a and 701b, respectively, high-k layers 801a and 801b.

Figure 9:
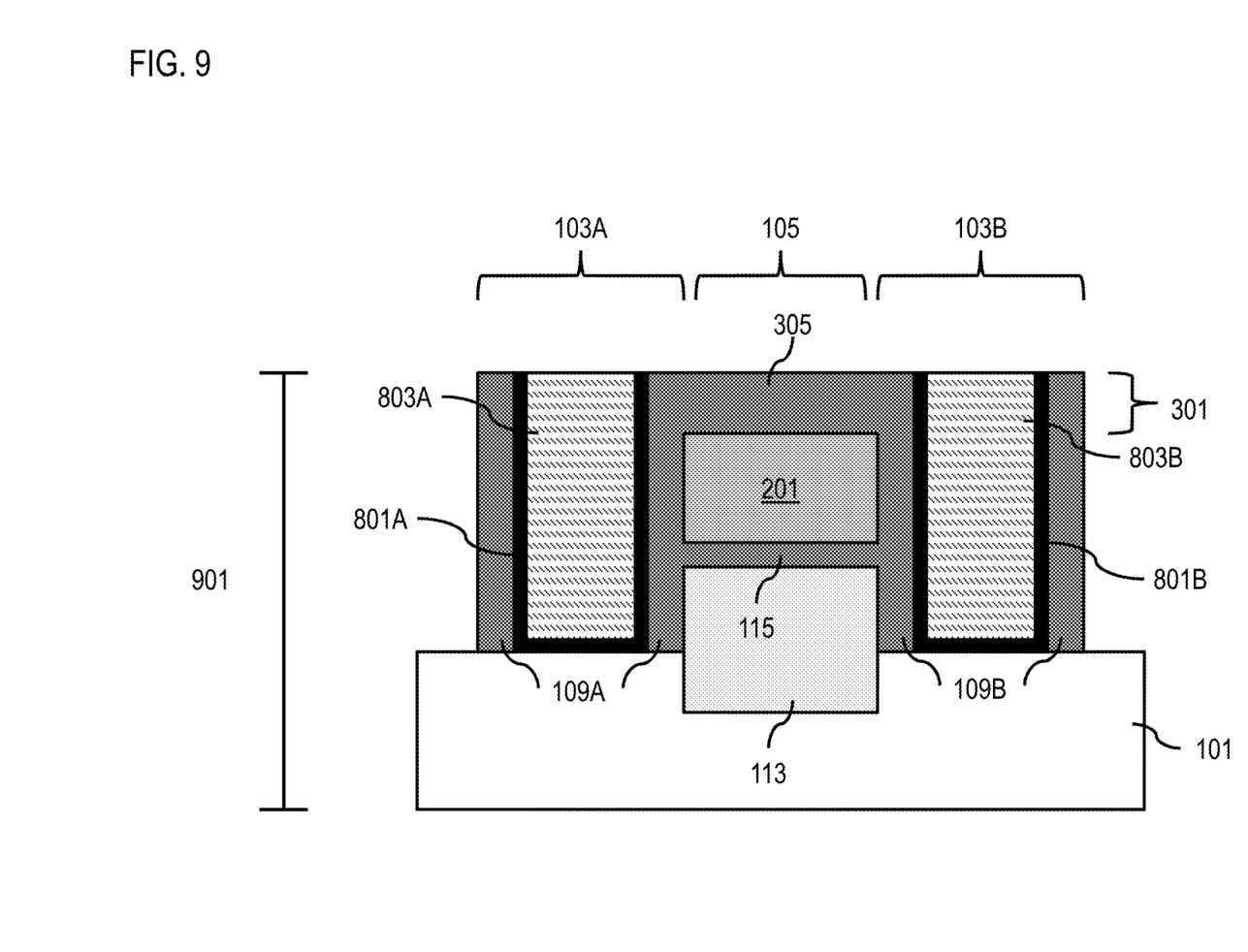

Adverting to FIG. 9, a CMP of the RMG electrodes 803a and 803b is performed down to a predetermined height 901 for the RMG electrodes 803a and 803b, followed by buffing the nitride layer 301 down to an upper surface of the RMG electrodes 803a and 803b. The CMP uses a high selectivity slurry to nitride, resulting in a precise gate height control, for instance, a height variation of less than 20 Å.

Figure 10:
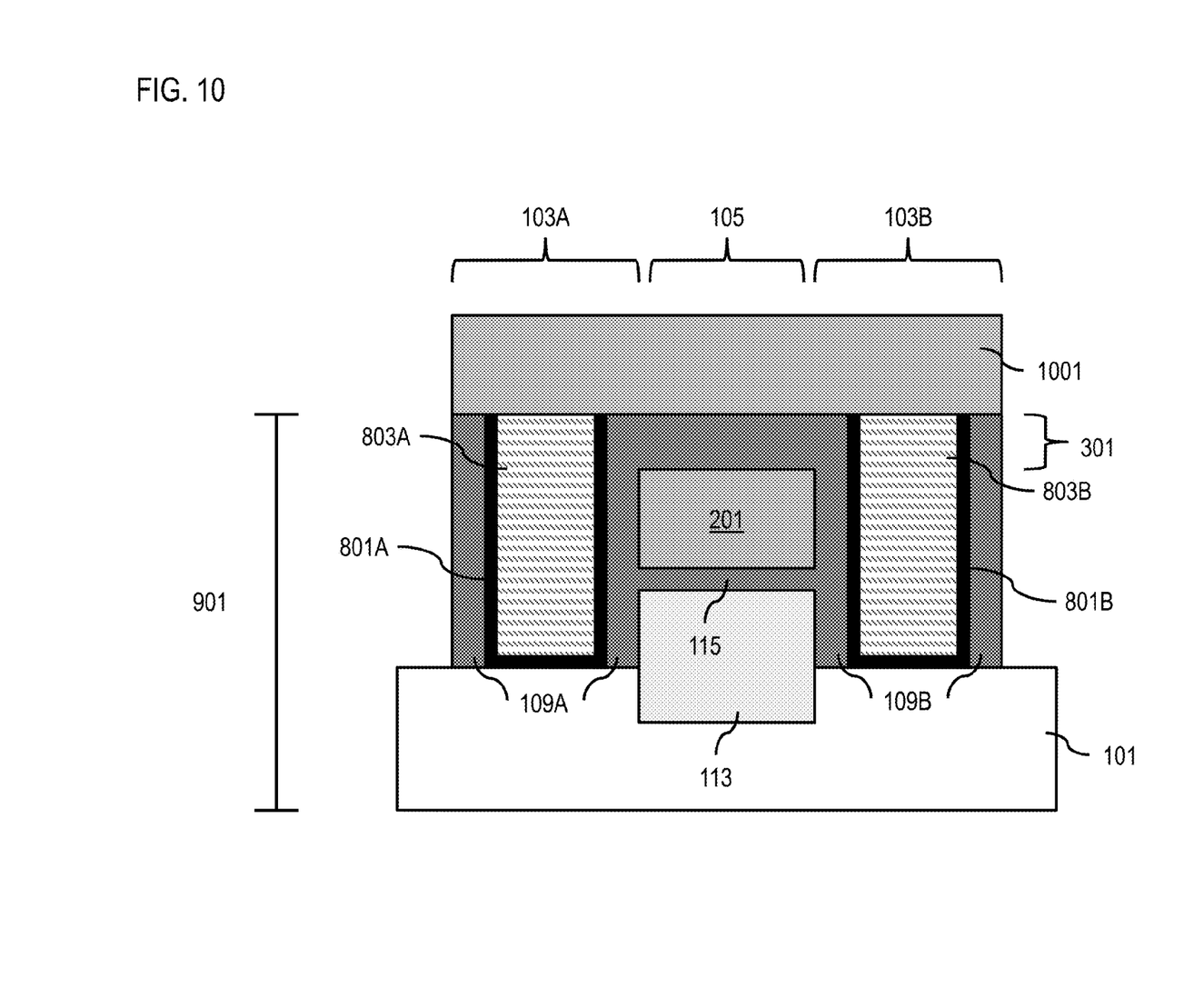
Figure 11:
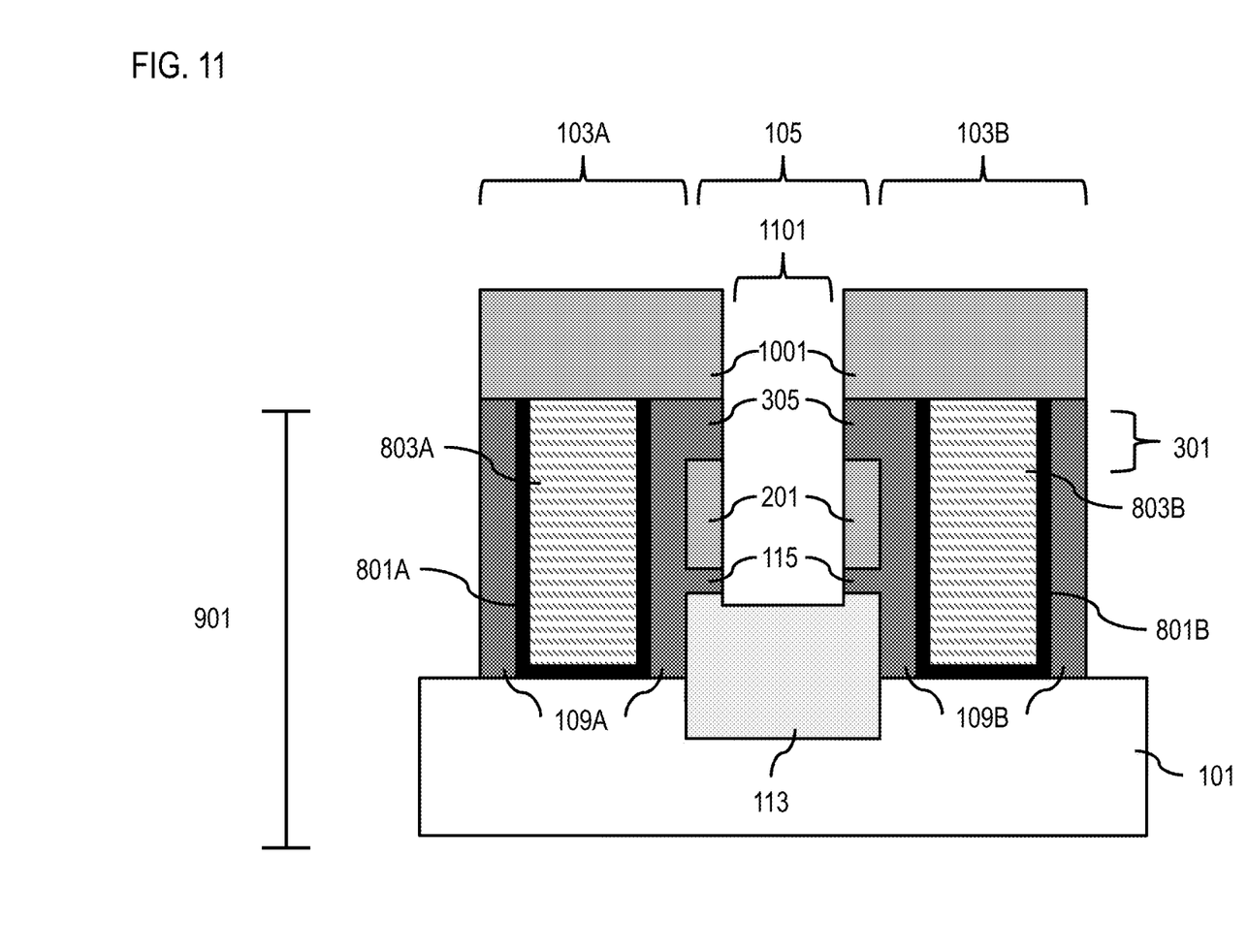
Figure 12:
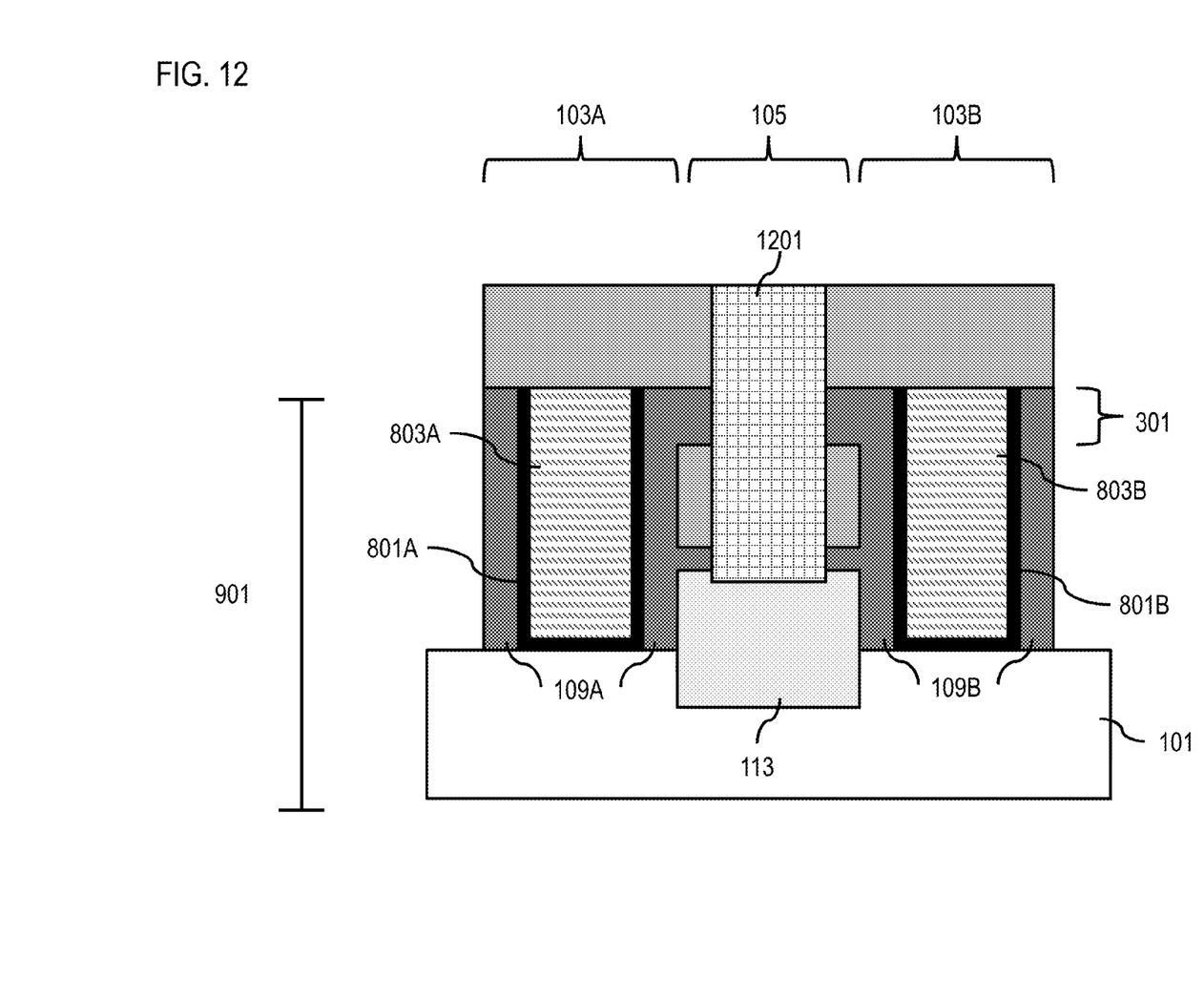

As illustrated in FIG. 10, a layer of interlayer dielectric (ILD) 1001 is formed over the RMG electrodes 803a and 803b, and source/drain region 105 of, for example, silicon dioxide or silicon nitride. Next, as illustrated in FIG. 11, a contact trench 1101 is formed in the drain/source region 105 through the ILD layer 1001, the second portion 305 of the nitride layer 301, the oxide 201, and the first nitride layer 115 down to the eSiGe/SiP 113. Further, a silicide is formed on the eSiGe/SiP 113. Adverting to FIG. 12, a tungsten (W) plug 1201 is formed in the contact trench 1101. Other metals such as aluminum (Al) and copper (Cu) may be used to form plug 1201. The remaining steps necessary to form an RMG device from the substrate 101, as illustrated in FIG. 12, may be performed using traditional methods.

The embodiments of the present disclosure can achieve several technical effects, including RMG devices having substantially planar topographies, resulting in an improved performance, reliability, and manufacturability. The present disclosure enjoys industrial applicability in any of various types of highly integrated semiconductor devices, particularly RMG devices in 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing on a substrate two dummy gate electrodes, each between a pair of spacers;
   providing a source/drain region between the two dummy gate electrodes; and
   forming a first nitride layer over the two dummy gate electrodes and the source/drain region, wherein the first nitride layer comprises a first portion over the dummy gate electrodes and a second portion over the source/drain region, and the second portion has an upper surface substantially coplanar with an upper surface of the dummy gate electrodes.

2. The method according to claim 1, wherein the source/drain region comprises:
   an embedded silicon germanium and/or silicon phosphate (eSiGe/SiP);
   a second nitride layer; and
   an oxide layer formed by flowable chemical vapor deposition (FCVD).

3. The method according to claim 2, comprising forming the oxide layer to a thickness of between 100 angstroms (Å) and 300 Å.

4. The method according to claim 2, further comprising:
   forming a layer of high density plasma (HDP) oxide on the second portion of the first nitride layer, wherein an upper surface of the HDP oxide is substantially coplanar with an upper surface of the first portion of the first nitride layer.

5. The method according to claim 4, comprising forming the HDP oxide layer by:
   depositing HDP oxide on the first and second portions of the first nitride layer; and
   performing chemical mechanical polishing (CMP) down to the upper surface to the first portion of the first nitride layer.

6. The method according to claim 4, further comprising:
   removing the first portion of the first nitride layer and the HDP oxide layer down to the upper surface of the dummy gate electrodes.

7. The method according to claim 6, further comprising:
   removing the dummy gate electrodes, forming a cavity between each pair of spacers.

8. The method according to claim 7, comprising removing the dummy gate electrodes by a wet and dry etch using the first nitride layer as a self-stop layer.

9. The method according to claim 7, further comprising:
   forming a high-k layer in each cavity, after removal of the dummy gate electrodes; and
   forming a replacement metal gate (RMG) electrode on each high-k layer.

10. The method according to claim 9, further comprising:
    performing CMP of the RMG electrodes down to a predetermined height for the RMG electrodes using a high selectivity slurry to nitride, followed by buffing the first nitride layer down to an upper surface of the RMG electrodes.

11. The method according to claim 10, further comprising:
    forming an interlayer dielectric (ILD) layer over the RMG electrodes and source/drain region;

forming a contact trench through the ILD, first nitride, oxide formed by FCVD, and second nitride down to the eSiGe/SiP;

forming a silicide on the eSiGe/SiP; and filling the contact trench with a metal plug.

12. A method comprising:

providing on a substrate two polysilicon gate electrodes, each between a pair of spacers;

providing a source/drain region between the two polysilicon gate electrodes, the source/drain region having an embedded silicon germanium and/or silicon phosphate (eSiGe/SiP), a first nitride layer, and an oxide layer formed by flowable chemical vapor deposition (FCVD);

SiCoNi etching the oxide layer to a thickness of between 100 angstroms (Å) and 300 Å;

forming a second nitride layer over the two polysilicon gate electrodes and the source/drain region, wherein the second nitride layer comprises a first portion over the polysilicon gate electrodes and a second portion over the source/drain region, and the second portion has an upper surface substantially coplanar with an upper surface of the polysilicon gate electrodes;

depositing a high density plasma (HDP) oxide on the first and second portions of the second nitride layer; and performing chemical mechanical polishing (CMP) of the HDP oxide down to the upper surface of the first portion of the second nitride layer, the upper surface of the HDP oxide surface on the second portion of the second nitride layer being substantially coplanar with an upper surface of the first portion of the second nitride layer;

removing the HDP oxide layer and the first portion of the second nitride layer down to the upper surface of the polysilicon gate electrodes;

removing the polysilicon gate electrodes by a partial dry etch followed by a wet etch using the second nitride layer as a self-stop layer, forming a cavity between each pair of spacers;

forming a high-k layer in each cavity, after removing the polysilicon gate electrodes; and forming a replacement metal gate (RMG) electrode of aluminum (Al) or tungsten (W) on each high-k layer.

13. The method according to claim 12, comprising:

performing CMP of the RMG electrodes down to a predetermined height for the RMG electrodes using a high selectivity slurry to nitride, the RMG electrodes having a height variation of less than 30 Å; and performing a nitride buffing down to the predetermined height for the RMG electrodes.

14. The method according to claim 13, comprising:

forming an interlayer dielectric (ILD) layer over the RMG electrodes and source/drain region;

forming a contact trench through the ILD, second nitride, oxide formed by FCVD, and first nitride layers down to the eSiGe/SiP;

forming a silicide on the eSiGe/SiP; and filling the contact trench with a tungsten (W) plug.

* * * * *